June 2, 1970 C. BUTENSCHÖN 3,515,955

SEMICONDUCTOR ARRANGEMENT

Filed Oct. 10, 1967 2 Sheets-Sheet 1

INVENTOR.
Claus Butenschön
BY Spencer & Kaye
ATTORNEYS

SEMICONDUCTOR ARRANGEMENT

Filed Oct. 10, 1967 2 Sheets-Sheet 2

INVENTOR
Claus Butenschön
BY Spencer & Kaye
ATTORNEYS 3,515,955

SEMICONDUCTOR ARRANGEMENT

Claus Butenschön, Nuremberg, Germany, assignor to Semikron Gesellschaft fur Gleichrichterbau und Elektronik m.b.H.

Filed Oct. 10, 1967, Ser. No. 674,255
Claims priority, application Germany, Oct. 27, 1966, S 106,742; Dec. 15, 1966, S 107,421
Int. Cl. H01l 1/12, 1/14
U.S. Cl. 317—234 30 Claims

ABSTRACT OF THE DISCLOSURE

A semiconductor arrangement, having a prepared semiconductor wafer with at least one pn-junction mounted on a metal base and encapsulated by a cup-shaped top which is joined to the base. The side of the wafer facing away from the base is in contact with an additional current conductor which, in turn, is connected to a lead-in that passes through a plate that forms part of the top. A casing, which forms theother part of the top and which is preferably made of plastic or plastic covered wire lattice, is attached at its lower edge to the base and at its upper edge to the plate so as to form, at both places a mechanically strong and hermetically sealed bond. Both the base and the plate are provided with attachment means which engage attachment means on the lower and upper edges of the casing, respectively, to form the bond.

BACKGROUND OF THE INVENTION

The present invention relates to a semiconductor arrangement having a base, which simultaneously serves to conduct electricity and to dissipate heat losses; a prepared semiconductor wafer with at least one pn-junction mounted on the base and a cup-shaped attachment, forming an upper casing which, in conjunction with the base, hermetically seals in the semiconductor wafer.

Semiconductor arrangements of the type just described are known in the art. The base, which is made of metal, is made plate or cup-shaped or provided with screw threads for attachment to an electrical chassis. The upper casing, which has been made either of a suitable metal or a ceramic, is provided with an insulated lead-in for connection with the current conductor or conductors extending upwardly from the semicondutor wafer.

This type of semiconductor arrangement is manufactured in the following manner. The semiconductor wafer is first placed on the base and the contact electrode which serves to connect the wafer with the upper current conductor brought in contact with the side of the wafer which faces away from the base. The upper current conductor or conductors are then connected to the contact-electrode and inserted into and fastened to the insulated lead-in of the cup-shaped upper casing. Predetermined and, preferably, specially designed casing surfaces are finally attached to matching surfaces on said base and, if required, an external terminal connected to a part provided therefor at the top of the lead-in.

These known semiconductor arrangements have, however, a number of disadvantages. The internal surface of the upper casing, when made, for example, of galvanized steel, exhibits surface reactions during the operation of the semiconductor element which often lead to a deterioration of the semiconductor arrangement properties. When, moreover, the semiconductor arrangement has a casing made of metal but a lead-in insulated with glass or ceramic, the points of connection of metal-glass or metal-ceramic are very sensitive to mechanical stress. These stresses can cause leaks in the semiconductor enclosure which usually lead to a reduction in the quality of the semiconductor element.

The edge regions of the upper casing and the base, which are especially designed so that the two may be joined together, are additionally very sensitive to shock.

The known types of enclosures, as well as their assembly with the other semiconductor elements in a semiconductor arrangement are also usually very costly since, even when metal parts with insulated lead-in are employed for the upper casing, the maintenance of minimum tolerances for surface leakage current and voltage arcing brings with it certain complex conditions of design and manufacture.

Furthermore, with the known types of semiconductor arrangements, special temperature stresses appear in the area of the insulated lead-ins; that is, where the metal current conductors pass through the glass or ceramic part of the casing whereby this area may cause interference.

Semiconductor arrangements which are completely embedded in or coated with an insulating plastic are also common. This type of construction is only suitable, however, for semiconductor elements of small dimensions.

SUMMARY OF THE INVENTION

An object of the present invention, therefore, is to eliminate the disadvantages described above of the semiconductor arrangements of the prior art.

More particularly, an object of the present invention is to produce a semiconductor casing at reasonable cost and of simple design which may be easily joined together with the metal lead-in and the metal base which carries the semiconductor wafer.

These and other objects, which will become apparent in the discussion that follows, are achieved according to the present invention by making the casing either of insulating plastic or of a plastic covered metal lattice and providing it with attachment means, at its upper and lower edges, in a manner to be described in detail below, for a mechanically strong, sealed connection with correspondingly formed attachment means in a plate carrying the lead-in and a metal base, respectively.

DESCRIPTION OF THE PREFERRED EMBODIMENTS

Figure 1:
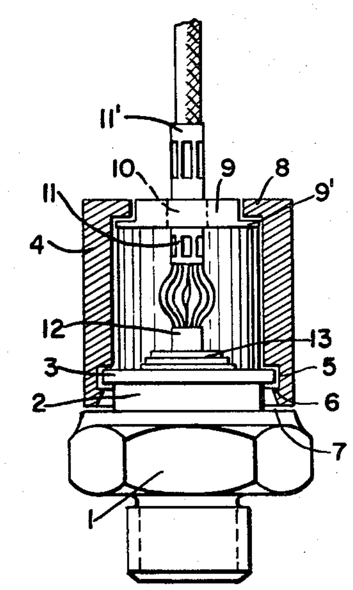
FIG. 1 is a side view, partly in cross section, of a complete semiconductor arrangement according to one embodiment of the present invention.

Turning now to the drawings, FIG. 1 shows a semiconductor arrangement according to one embodiment of the present invention, comprising essentially a base 1, made preferably of copper, a semiconductor wafer 13, a casing 4 and a top plate 9. The top 2 of the base 1 is provided with a flanged edge 3 which serves to the mechanical connection of the base 1 and the casing 4. The prepared wafer 13 is mounted on the upper surface of the top 2. The side of the wafer facing away from the base is in contact with the contact electrode 12 which, in turn, is connected by the upper current conductor to a lead-in 10. The lead-in 10 is provided with cartridge-shaped segments 11 and 11' which form connecting terminals and forms a prefabricated unitized element with the top plate 9. The edge 9' of the plate 9 is suitably designed for a laminar connection with the edge 8 of the casing 4. The top plate 9 can be made of a metal, a ceramic, a plastic or any material that meets the mechanical and electrical requirements. The connection between the edges 8 and 9' may be realized, for example, by providing the contacting surfaces with a metallic coating or layer and soldering these layers together.

The hollow cylindrical casing 4, which will be referred to hereinbelow as the "cap," is provided with a concentric groove 5 in its lower inner surface for a strong connection with the base. The cap and the base may thus be connected together by placing the cap 4 on top 2 of the base and pressing the cap down until the flange 3 engages the groove 5. To facilitate the insertion of the flange 3 the lower inner surface 7 of the cap 4 is preferably concentrically beveled so that the internal diameter of the lower extremity of the cap 4 is slightly larger than that of the flange 3 of the base 1. The internal diameter of the lower extremity 6 of the groove 5 is also simultaneously slightly increased to give it only a slightly smaller diameter than that of the flange 3 of the base 1.

The cap 4 has a wall thickness sufficient to accommodate the groove 5 and to meet the requirements of mechanical stability and elasticity when joined together with the base. The groove 5 is dimensioned to fit the flange 3 of the base 1 and is of sufficient depth to provide a suitable support for the side forming its upper extremity which rests on the top of the base. The cap 4 can be made of a duroplastic, such as polytrichloroethylene.

Figure 2:
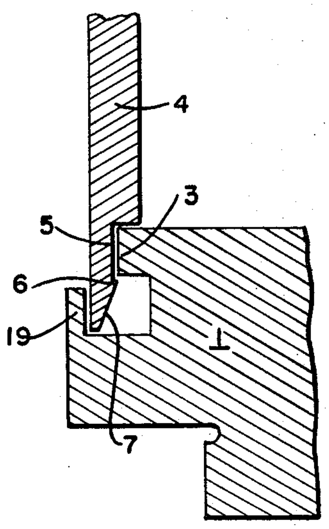
FIG. 2 is an enlarged elevational cross-sectional view of the attachment means on both the casing and the base according to an embodiment of the present invention.

FIG. 2 shows in cross section another embodiment of the junction of the cap 4 and the base 1. In addition to the flange 3 shown in FIG. 1, the generated surface of the base in this embodiment is provided with an axial concentric flange 19 which can extend in height either to the top of the beveled portion 7 of the cap 4 or even to the height of the top surface of the base which carries the semiconductor wafer. The flange 19 improves the support the cap 4 when joined with the base 1 and insures face-to-face contact of the cap and base connecting surfaces. The lower outer surface of the cap 4 and the inner surface of the flange 19 can be beveled, if necessary, so that, when the cap is pressed down on the base, its inner beveled surface will ride over the flange 3 and its outer beveled surface will be pressed inward by the inner beveled surface of the flange 19 holding the cap 4 with its groove 5 tightly against the flange 3 of the base 1.

Figure 3:
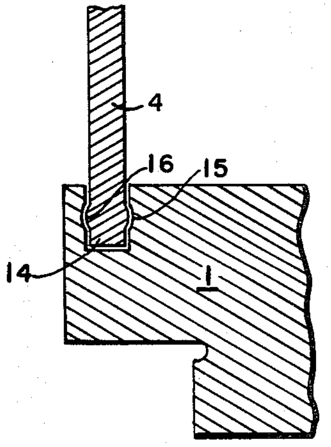
FIG. 3 is an enlarged elevational cross-sectional view of the attachment means on both the casing and the base according to an embodiment of the present invention.

FIG. 3 illustrates another embodiment which provides mechanical support for the cap 4 respectively mechanical connection between the cap 4 and the base 1. The base 1 is provided with a concentric groove 14 having recesses

15 on both of its inner sides. At least the lower portion of the cap 4 is made with a thickness that just fits inside the groove 14 and is provided with ridges 16 to hold the cap in place. The dimensions of the recesses 15 and the ridges 16 are chosen so that the ridges 16 may undergo a slight deformation, due to the elasticity of the material of the cap 4, when the cap is inserted in the base.

The embodiment shown in FIG. 3 might be modified to the extent that either one or both sides of the groove 14 in the base 1 are provided with the ridge 16 and either one or both of the corresponding sides of the cap 4 are provided with the recess 15.

Figure 4:
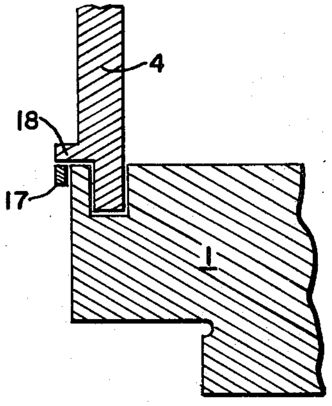
FIG. 4 is an enlarged elevational cross-sectional view of the attachment means on both the casing and the base according to an embodiment of the present invention.

FIG. 4 shows another embodiment of the present invention which provides a good mechanical connection between the cap 4 and the base 1. This embodiment employs to advantage known techniques of joining metals with plastics. The cap 4, which is inserted in a groove in the base 1, is also provided with a flange 18 which extends beyond the lateral edge of the base 1. A ring 17 of suitable plastic surrounds the lateral surface of the base 1 and is arranged to fit tightly against the flange 18. The ring 17 and the flange 18 may thus be welded together to form a strong and leak-proof connection between the cap and the base.

Figure 5:
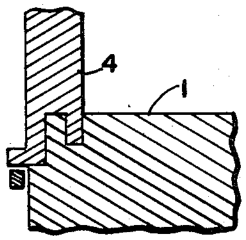
FIG. 5 is an enlarged elevational cross-sectional view of the attachment means on both the casing and the base according to an embodiment of the present invention.

The embodiment shown in FIG. 4 may be modified slightly by forming a groove in the lower edge of the cap 4, as illustrated in FIG. 5. If the inner side of the groove in the cap 4 is then inserted in a corresponding groove in the base 1, and the outer side of the groove in the cap overlaps the outside surface of the base, there results a multi-step connection. The outer side of the cap 4 which overlaps the base can then also be provided with a flanged end and welded to a matching surface of the base.

Figure 6:
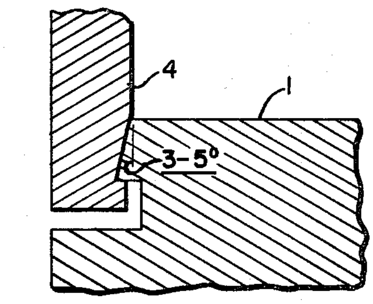
FIG. 6 is an enlarged elevational cross-sectional view of the attachment means on both the casing and the base according to an embodiment of the present invention.

A further advantageous manner of connecting the cap 4 and the base 1 according to the invention is shown in FIG. 6. Both the inner edge of the cap and the surface of the flange 3 of the base are beveled and matched to fit together. The bevel is made with an angle of 3 to 5 degrees and preferably forms a so-called Morse taper shank so that the base 1 in the cap 4 may be connected simply by pressing the two together. So that the cap and base connection can not be broken by vibrational stresses, to which the semiconductor arrangement is exposed to during operation, the inner edge of the cap 4, at the end of the beveled portion, may be provided with a small raised projection, similar to the edge 6 shown in FIG. 1. As the cap 4 is pressed downward on top 2 of the base 1, the projection slides over the beveled edge of the flange 3 and engages the flange thus creating a strong connection.

Figure 7:
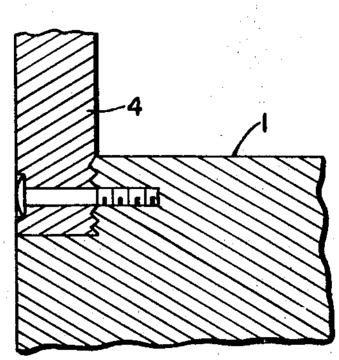
FIG. 7 is an enlarged elevational cross-sectional view of the attachment means on both the casing and the base according to an embodiment of the present invention.

The cap 4 may also be attached to the base 1 by means of threads as shown in FIG. 7. The side of the base 1 and the inner surface of the hollow cylindrical cap 4 are provided with suitable matched threads so that the cap 4 may be screwed onto the base 1 in a simple manner. To insure that the connection does not become loose, a threaded or slotted pin may subsequently be inserted into the screwed joint.

Figure 8:
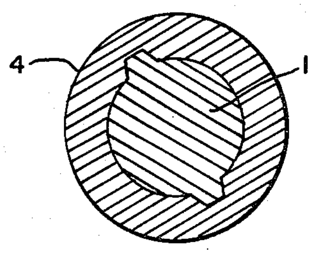
FIG. 8 is a vertical view taken on a cross section through the casing and the base where the casing and the base are joined together, of the attachment means on both the casing and the base according to an embodiment of the present invention.

FIG. 8 illustrates still another manner in which the cap 4, which is preferably made of plastic, may be joined to the base 1 to form an advantageous semiconductor enclosure; the cap and base are joined by means of a so-called bayonet union or slide catch. Suitable ridges are provided for this purpose, for example, on the circumference of the flange-shaped edge 3 or the upper surface of the top 2 of the base 1. These ridges fit in matching grooves of a predetermined arc length on the internal surface of the cap. If the cap is placed on the base and twisted, the ridges will come to rest at the end of the grooves, forming a strong connection. Likewise, the internal surface of the cap 4 can be provided with the ridges while the slot-shaped recesses are made in the surface of the flange 3 of the base 1.

Figure 9:
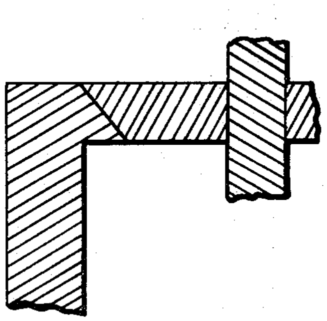
FIG. 9 is an enlarged elevational cross-sectional view of the attachment means on both the casing and the plate carrying the lead-in according to an embodiment of the present invention.

The top plate 9 which, together with the lead-in 10 and its cartridge-shaped parts 11 and 11' which serve to receive the stranded ends of the current conductor, is a separately manufactured unit, can be made with a beveled edge as illustrated in FIG. 9 instead of the step shown in FIG. 1. The lead-in 10 with its adjacent sections 11 and 11' can be made from a single lathe-turned metal piece.

The lead-in for the upper current conductor can also be made by shaping a plate made of a suitable metal such as copper. This plate may thus be provided with a extending cartridge-shaped projection at its center which, depending on the profile of the current conductor, may be connected to the conductor either by pinching or by soldering. The final plate which is made of a single metal piece and includes parts 9, 10 and 11 shown in FIG. 1, can then be coated on one or both surfaces with a suitable plastic. In order to obtain a suitable plastic fused connection with the cap 4, the side of the plate 9 facing away from the base may be provided with a suitable contact surface, as if necessary, an overhanging edge, which matches a corresponding step in the surface of the cap 4.

The semiconductor arrangement according to the invention is assembled in the following manner. A prepared semiconductor wafer 13 is first mounted on the base 1. The contact electrode 12, connected to the one or multiple strand current conductor, which with the lead-in 10 with its terminals 11 and 11' and the top plate 9 form a single unit of construction, is made to contact the surface of the semiconductor wafer that faces away from the base. The cap 4, which is designed to encase the semiconductor wafer, is then placed on top 2 of the base 1 and pressed down over the base flange 3 until the specially provided ridge 6 catches the base. The edge 9' of the top plate 9 is simultaneously made to rest against the inside of the upper edge 8 of the cap 4. The connections between the base 1 and the cap 4 and the cap 4 and the top plate 9 may finally be sealed, preferably in a single process step, for example, by soldering or welding.

Figure 10:
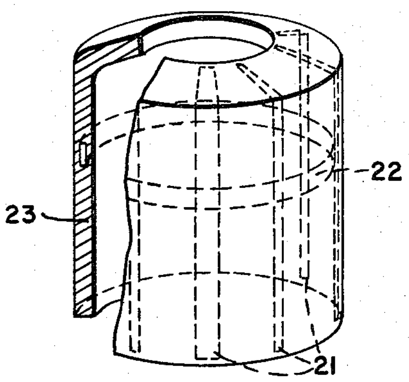
FIG. 10 is a perspective view of a casing according to an embodiment of the present invention.
Figure 11:
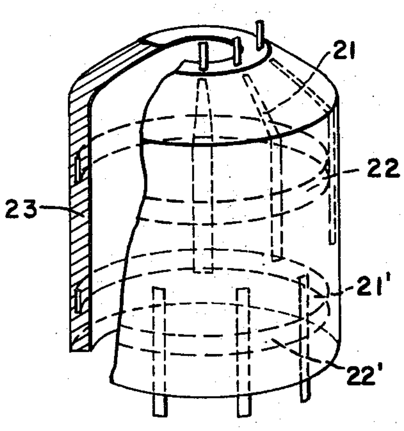
FIG. 11 is a perspective view of a casing according to an embodiment of the present invention.

Further embodiments of the casing of the semiconductor arrangement according to the invention are illustrated in FIGS. 10 and 11. In these embodiments the casing comprises a metal frame shaped in a desired fashion and covered with a layer of plastic.

FIG. 10 illustrates such a casing having resilient metal strips 21 which are solidly interconnected by means of transverse strips 22. This metal structure, which forms a cage-like skeleton, is then encased on all sides by a plastic layer 23 sufficiently thick to provide the necessary electrical insulation and mechanical strength. Any arbitrary part of the plastic layer may be reinforced, as desired by increasing its thickness.

FIG. 11 illustrates a modification of the plastic casing wherein the metallic skeleton comprises two lattices 21, 22 and 21', 22', electrically insulated from each other. With this configuration, by permitting the resilient metal strips 21 and 21' to project out of the plastic body 23 in opposite directions, it is possible to employ the strips to connect the casing to the current conducting lead-in as well as the base 1 which carries the semiconductor wafer.

With both the embodiments shown in FIG. 10 and 11, grooves or recesses as well as projections on the base can serve to catch the bell or cylindrically shaped casing, if the latter is provided with matching grooves and projections on its lower edge, and insure, by means of the spring action of the metal skeleton and the elasticity of the plastic, a strong and airtight seal. The recesses and matching projections in the casing may be so arranged that they may be engaged only against the spring force.

The current conducting part of the lead-in is preferably inserted into a mechanically rugged part, such as a plate, which is likewise provided with recesses and projections. The plate may then be attached to the resilient plastic casing in the same manner as was the base; that is, the upper edge of the casing may likewise be provided with matching projections and recesses which, due to the spring action of the enclosure skeleton in conjunction with the elasticity of the plastic body, engage the plate and insures a sealed, mechanically strong connection.

The metal spring-acting skeleton may preferably be made of strips in the shape of bands or wires. The plastic covering may be made variously thick at various places provided it is always kept thick enough to insure sufficient dielectric strength and electrical insulation as well as sufficient mechanical strength to hermetically seal in the sensitive elements of the semiconductor wafer.

It will be understood that the above description of the present invention is susceptible to various modifications, changes and adaptations, and the same are intended to be comprehended within the meaning and range of equivalents of the appended claims.

I claim:

1. A semiconductor arrangement comprising, in combination:

(a) an electrically conductive base having first attachment means;
(b) a semiconductor wafer having at least one pn-junction and mounted on said base;
(c) a conductor element contacting said wafer;
(d) plate means having second attachment means at its edge;
(e) electrical lead-in means passing through said plate means and connected to said conductor element; and
(f) a casing having upper and lower edges and mounted on said base and surrounding said wafer, said casing having at its lower edge third attachment means which engage said first attachment means of said base and having at its upper edge fourth attachment means which engage said second attachment means of said plate whereby said base, said casing and said plate means together form a mechanically stable and sealed unit within which said semiconductor wafer is encapsulated;
(g) said casing comprising a metal skeleton coated with plastic, said first, second, third and fourth attachment means comprising recesses and projections.

2. Semiconductor arrangement as defined in claim 1, wherein said metal skeleton is bell-shaped.

3. Semiconductor arrangement as defined in claim 1, wherein said metal skeleton is cage-shaped.

4. Semiconductor arrangement as defined in claim 1, wherein said metal skeleton comprises a plurality of metal strips which are interconnected to form at least one flexible lattice.

5. Semiconductor arrangement as defined in claim 4, wherein said metal strips are metal bands.

6. Semiconductor arrangement as defined in claim 4, wherein said metal strips are metal wires.

7. Semiconductor arrangement as defined in claim 1, wherein said metal skeleton ends in metal strips extending through said lower edge of said casing, said metal strips forming part of said third attachment means and being separated from each other by a distance sufficient to preserve the elasticity of said third attachment means.

8. Semiconductor arrangement as defined in claim 1, wherein said metal skeleton comprises a plurality of metal strips interconnected to form two essentially cylindrical lattices, said plastic encasing said lattices holding said lattices on a common axis, one above the other, said lattices being electrically insulated from each other.

9. Semiconductor arrangement as defined in claim 2, wherein said metal skeleton comprises a plurality of metal strips interconnected to form two basket-shaped lattices electrically insulated from each other.

10. Semiconductor arrangement as defined in claim 4, wherein some of said metal strips extend below said lower edge of said casing forming part of said third attachment means.

11. Semiconductor arrangement as defined in claim 1, wherein said third attachment means includes projections and wherein said first attachment means includes grooves thereby to allow said projections to engage in said grooves and, by means of the spring action of said metal skeleton and said plastic, to form a sealed and mechanically strong joint.

12. Semiconductor arrangement as defined in claim 1, wherein said plastic coating said metal skeleton encases said metal skeleton and has different thicknesses at different places, said thicknesses being sufficient to provide electrical insulation.

13. A semiconductor arrangement comprising, in combination:

(a) an electrically conductive base having first attachment means;
(b) a semiconductor wafer having at least one pn-junction and mounted on said base;
(c) a conductor element contacting said wafer;
(d) plate means having second attachment means at its edge;
(e) electrical lead-in means passing through said plate means and connected to said conductor element; and
(f) a casing having upper and lower edges and mounted on said base and surrounding said wafer, said casing having at its lower edge third attachment means which engage said first attachment means of said base and having at its upper edge fourth attachment means which engage said second attachment means of said plate whereby said base, said casing and said plate means together form a mechanically stable and sealed unit within which said semiconductor wafer is encapsulated;
(g) wherein said first attachment means includes a peripheral flange of a predetermined thickness projecting laterally outward from said base and a peripheral recess, formed in said base below said flange, and wherein said third attachment means includes a peripheral groove extending outward with respect to the axis of said casing from the inner surface of said casing and having a width at least equal to said thickness of said flange, and an inner surface, below said groove, which is inclined outwardly from said groove to the lower extremity of said casing whereby said flange engages in said groove and said inner surface below said groove engages in said recess.

14. Semiconductor arrangement as defined in claim 1, wherein said third attachment means is the lower portion of the wall of said casing and wherein said first attachment means is a groove in the upper surface of said base, said groove being approximately as wide as said wall, whereby said lower portion of said wall may be fitted into said groove.

15. A semiconductor arrangement comprising, in combination:

(a) an electrically conductive base having first attachment means;
(b) a semiconductor wafer having at least one pn-junction and mounted on said base;
(c) a conductor element contacting said wafer;
(d) plate means having second attachment means at its edge;
(e) electrical lead-in means passing through said plate means and connected to said conductor element; and
(f) a casing having upper and lower edges and mounted on said base and surrounding said wafer, said casing having at its lower edge third attachment means which engage said first attachment means of said base and having at its upper edge fourth attachments which engage said second attachment means of said plate whereby said base, said casing and said plate means together form a mechanically stable and sealed unit within which said semiconductor wafer is encapsulated;
(g) wherein said third attachment means is the lower portion of the wall of said casing and wherein said first attachment means is a groove in the upper surface of said base, said groove being approximately as wide as said wall, whereby said lower portion of said wall may be fitted into said groove;
(h) wherein at least one side of said lower portion of said wall is provided with a ridge and the corresponding at least one side of said groove is provided with a recess, whereby said ridge may fit into said groove and hold said casing and said base together.

16. Semiconductor arrangement as defined in claim 1, wherein said third attachment means is at least one groove in the lower inner surface of said casing and said first attachment means is at least one groove in the upper surface of said base, whereby at least the inner projection in the lower portion of said casing created by said groove fits inside said at least one groove in said base.

17. Semiconductor arrangement as defined in claim 16, wherein said groove in said casing continues around the entire lower surface of said casing and closes upon itself.

18. A semiconductor arrangement comprising, in combination:

(a) an electrically conductive base having first attachment means;
(b) a semiconductor wafer having at least one pn-junction and mounted on said base;
(c) a conductor element contacting said wafer;
(d) plate means having second attachment means at its edge;
(e) electrical lead-in means passing through said plate means and connected to said conductor element; and
(f) a casing having upper and lower edges and mounted on said base and surrounding said wafer, said casing having at its lower edge third attachment means which engage said first attachment means of said base and having at its upper edge fourth attachment means which engage said second attachment means of said plate whereby said base, said casing and said plate means together form a mechanically stable and sealed unit within which said semiconductor wafer is encapsulated;
(g) wherein said third attachment means includes a first bevel on one of the lower surfaces of said casing and said first attachment means includes a second bevel on the corresponding surface of said base which second bevel matches said first bevel.

19. Semiconductor arrangement as defined in claim 18, wherein said first bevel extends around an entire circumference of said casing forming a cone.

20. Semiconductor arrangement as defined in claim 18, wherein said one surface is the inner surface of said casing.

21. Semiconductor arrangement as defined in claim 18, wherein said one surface is the outer surface of said casing.

22. Semiconductor arrangement as defined in claim 18, wherein said first and second bevels make an angle with respect to the vertical in the range of 3 to 5 degrees.

23. Semiconductor arrangement as defined in claim 19, wherein said third attachment means includes a ring-shaped ridge on said one of said lower surfaces and said first attachment means includes a matching ring-shaped groove on said corresponding surface, whereby when said casing is joined with said base, said ridge engages in said groove.

24. Semiconductor arrangement as defined in claim 1, wherein said first and third attachment means are surfaces on said base and said casing, respectively, which are provided with matching threads, whereby said casing may be screwed onto said base.

25. Semiconductor arrangement as defined in claim 1, wherein said first and third attachment means include surfaces on said base and said casing, respectively, which are provided with matching grooves and ridges by means of which a bayonet catch is formed and said first and third attachment means further include annular surfaces on said base and said casing, respectively, said surface included in said third attachment means being the lower extremity of said casing and fitting flush against said surface included in said first attachment means.

26. Semiconductor arrangement as defined in claim 1, wherein said base includes a plate-shaped top of a predetermined thickness, the peripheral edge of which overhangs the vertical sides of said base immediately below said top, and wherein said third attachment means includes a peripheral groove extending outward with respect to the axis of said casing from the inner surface of said casing and having a width at least equal to said thickness of said top, whereby said semiconductor wafer is mounted on said top and said peripheral edge engages in said groove to attach said base to said casing.

27. Semiconductor arrangement as defined in claim 1, wherein said third attachment means includes a flange extending outward with respect to the axis of said casing from the outer surface of said casing and wherein said first attachment means includes a plastic ring surrounding the peripheral surface of said base and shaped to fit against said flange, whereby said casing and said base are joined by welding said flange to said ring.

28. Semiconductor arrangement as defined in claim 1, wherein said second attachment means includes at least one first step on the peripheral edge of said plate and said fourth attachment means includes at least one second step, of approximately equal size and of opposite orientation to said one first step, on said upper edge of said casing, whereby said at least one first step fits into said at least one second step.

29. Semiconductor arrangement as defined in claim 1, wherein said second attachment means includes a first bevel of a predetermined angle at the peripheral edge of said plate and said fourth attachment means includes a second bevel, of said predetermined angle, on said upper edge of said casing, whereby said first bevel fits flush against said second bevel.

30. Semiconductor arrangement as defined in claim 29, wherein said plate is circular and said casing is cylindrical.

References Cited

UNITED STATES PATENTS

| | | | |
|---|---|---|---|
| 2,956,160 | 10/1960 | Sharpless | 317—234 X |
| 3,047,781 | 7/1962 | Eannarino | 317—234 |
| 3,226,603 | 12/1965 | Finn et al. | 317—234 |
| 3,274,458 | 9/1966 | Boyer et al. | 317—234 |
| 3,401,315 | 9/1968 | Scott et al. | 317—234 |
| 3,401,317 | 9/1968 | Gault | 317—234 |

FOREIGN PATENTS

| | | |
|---|---|---|
| 691,931 | 8/1964 | Canada. |
| 878,590 | 10/1961 | Great Britain. |

JOHN W. HUCKERT, Primary Examiner

R. F. POLISSACK, Assistant Examiner

U.S. Cl. X.R.

317—235